United States Patent [19]

Ozawa et al.

[11] Patent Number: 5,225,026
[45] Date of Patent: Jul. 6, 1993

[54] BONDING METHOD AND APPARATUS THEREFOR

[75] Inventors: Kanji Ozawa; Yukitaka Sonoda, both of Tokyo, Japan

[73] Assignee: Kabushiki Kaisha Shinkawa, Tokyo, Japan

[21] Appl. No.: 801,443

[22] Filed: Dec. 2, 1991

[30] Foreign Application Priority Data

Nov. 30, 1990 [JP] Japan .................... 2-336610

[51] Int. Cl.$^5$ .................................. G01D 5/28
[52] U.S. Cl. ................................ 156/378; 156/64; 29/721; 29/833; 29/834; 356/400
[58] Field of Search ............. 156/64, 378; 29/721, 29/833, 834; 356/400

[56] References Cited

U.S. PATENT DOCUMENTS

| | | | |
|---|---|---|---|
| 4,668,095 | 5/1987 | Maeda | 356/400 |
| 5,044,072 | 9/1991 | Blais et al. | 29/834 |
| 5,133,603 | 7/1992 | Suzuki et al. | 356/400 |

FOREIGN PATENT DOCUMENTS 2-26379  6/1990  Japan .

OTHER PUBLICATIONS

Gaston, *IBM Technical Disclosure Bulletin*, vol. 25, No. 5, Oct. 1982.

Primary Examiner—David A. Simmons
Assistant Examiner—Mark A. Osele
Attorney, Agent, or Firm—Koda and Androlia

[57] ABSTRACT

Two parts to be bonded together, such as a circuit board and a chip, are brought into one-above-the-other relationship, and before bonding is performed, a detecting device with an upper opening and a lower opening is set between the two parts, and by the use of optical system that is lights which passes through the openings, a positional alignment between the two parts is performed by correcting any discrepancy between the two so that the two parts are properly set one on the other and accurate bonding is executed to the two parts.

3 Claims, 6 Drawing Sheets

BONDING METHOD AND APPARATUS THEREFOR

BACKGROUND OF THE INVENTION

1. Field of the Invention

The present invention relates to a bonding method and apparatus which are used to bond two parts and more particularly to a alignment method and apparatus which align the two parts by correcting any positional discrepancy between the two.

2. Prior Art

When bonding two elements, there are several different ways. In chip bonding, chips are bonded to lead frames or circuit boards. Outer bonding is to bond outer leads of solid devices to lead frames or circuit boards, and in inner lead bonding, chips are bonded to inner leads installed on a tape carrier.

In these bonding methods wherein two elements or two parts are bonded together, it is necessary to detect the positional discrepancy of one part relative to the other by means of detection means and correct the positional discrepancy on the basis of obtained detection results so that the two parts are positionally aligned.

A conventional bonding device in which one part is held by vacuum suction adhesion, conveyed onto another part and bonded there is disclosed in the Japanese Patent Publication (Kokoku) No. 2-26379. In this device, the pattern on one part is detected in the bonding position, while the pattern on the other part is detected in a position which is separated from the bonding position. Then, the part which is held by vacuum suction adhesion and conveyed is conveyed to a point above the other part, so that the two parts are positionally aligned, correcting any relative positional discrepancy between the two parts.

In this prior art device, the positional discrepancy between the two parts is detected with one of the two parts in a position that is away from the position of the other part. Accordingly, when one part is conveyed from the detection position to the bonding position, that is, above the other part, a mechanical operation error, that is inherent in the conveying means, makes it impossible to obtain a high-precision positional alignment of the two parts.

SUMMARY OF THE INVENTION

Accordingly, the object of the present invention is to provide a bonding method and apparatus which makes it possible to obtain a high-precision positional alignment of the two parts described above.

The object of the present invention is accomplished by a unique method which includes (a) a conveying process in which one part is conveyed to a point above or below another part, (b) a detection process in which patterns on the two parts are detected, (c) a positional alignment process in which the two parts are positionally aligned (using one of the parts as a standard) on the basis of the detection results obtained in the detection process, and (d) a bonding process in which the two positionally aligned parts are bonded. In this bonding method, the detection process is accomplished by positioning a detecting device which has upper and lower detection ports between the two parts (with one of the parts conveyed to a point above or below the other part), and detecting the relative positional discrepancy between the two parts.

Furthermore, in the bonding apparatus which accomplishes the object of the present invention, (a) one part is held and conveyed to a point above or below another part, (b) the two parts are then positionally aligned, and (c) the two parts are then bonded. In such a structure, detecting device is utilized which has upper and lower detection ports, is moved between the two parts with one of the two parts positioned above or below the other part, and detects the respective patterns on the parts above and below by means of the upper and lower detection ports.

In the above-described bonding method and apparatus, the two parts that are to be bonded are positioned one above the other, and detection is accomplished by positioning a detecting device between the two parts. Accordingly, after the detection of any positional discrepancy is completed, it is necessary to move the parts only slightly. Specifically, in cases where the upper and lower detection ports formed in the detecting device are located on the same axis, the parts are moved only by an amount corresponding to the positional discrepancy. Furthermore, in cases where the upper and lower detection ports are offset, it is necessary to move the parts only by an amount corresponding to the positional discrepancy plus an amount corresponding to the offset.

DETAILED DESCRIPTION OF THE INVENTION

One embodiment of the present invention will be described below with reference to FIGS. 1 through 6. In this embodiment, the present invention is applied to chip bonding method and apparatus in which a chip is bonded to a circuit board.

Figure 1:
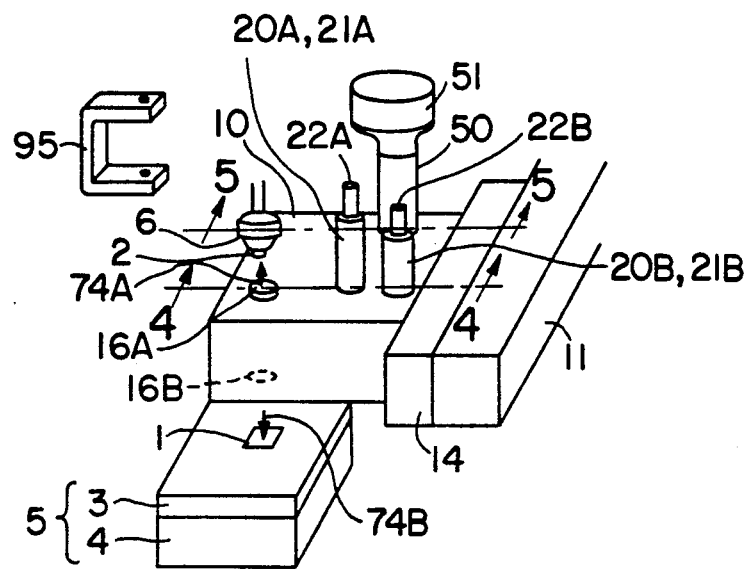
FIG. 1 is an external perspective view which illustrates one embodiment of the present invention.
Figure 2:
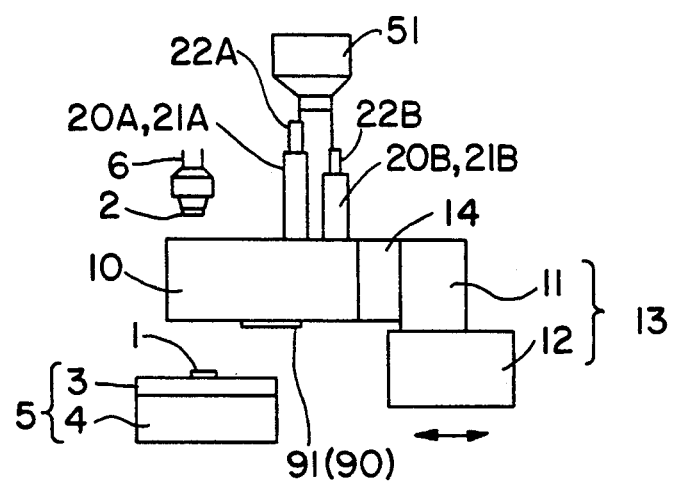
FIG. 2 is a front view thereof.

As shown in FIGS. 1 and 2, circuit board 1 is positioned and held on a workpiece stand 5 which consists of a hot plate 3 and a heater block 4, etc. Chip 2 is picked up through vacuum suction adhesion by a bonding tool 6 from a chip pick-up position (not shown) and is conveyed to a point above the circuit board 1. The bonding tool 6 is then lowered so that the chip is bonded to the circuit board 1.

A detection apparatus 10 which detects any positional discrepancy between the circuit board 1 and the chip 2 is mounted via a vertical slider 14 to the X stage 11 of an XY stage 13, so that the position of the detecting device 10 is adjusted along the vertical axis. The XY stage 13 consists of a universally known X stage 11 and Y stage 12.

The detecting device 10 is constructed as shown in FIGS. 3 through 6. Case 15 which accommodates the optical system of the detecting device 10 consists of a case proper 15a which is open at the bottom, and a bottom lid 15b, which is fastened to the undersurface of the case proper 15a.

Figure 3:
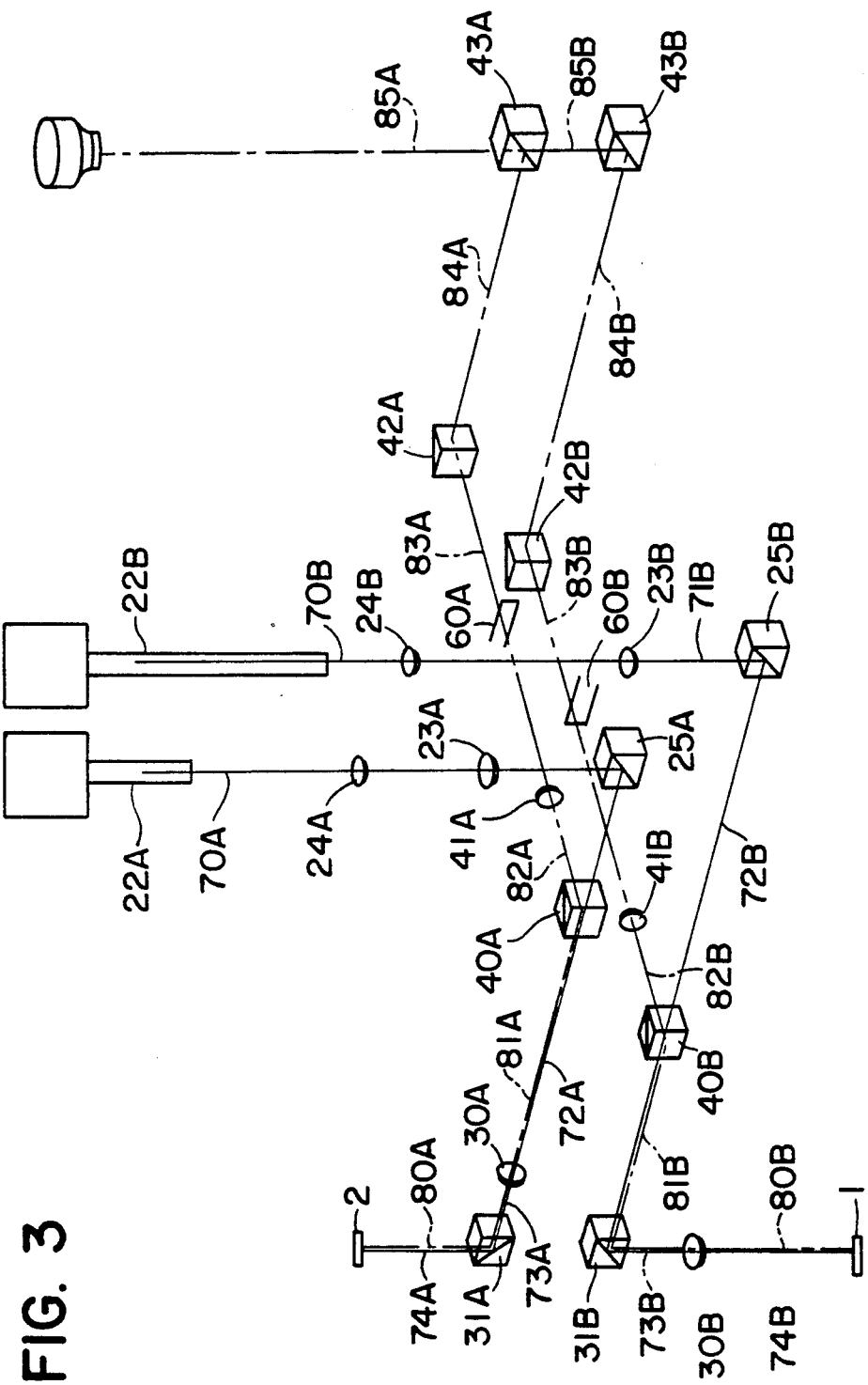
FIG. 3 is an explanatory diagram of the optical system used in the present invention.
Figure 4:
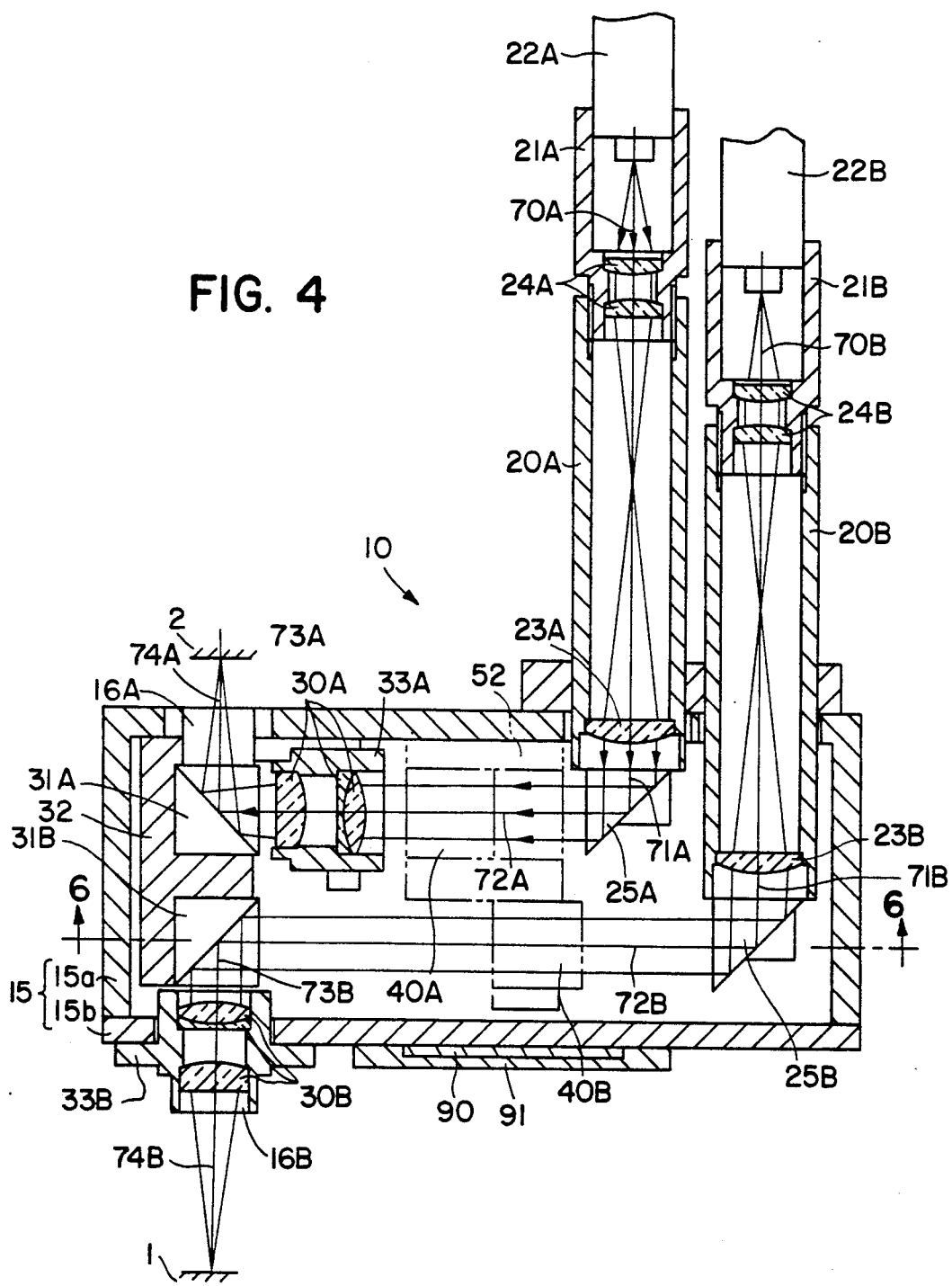
FIG. 4 is an enlarged cross section taken along 4—4 in FIG. 1.

As is shown in FIGS. 3 and 4, a first upper lamp holder 20A and a first lower lamp holder 20B are attached side by side to the upper surface of the case proper 15a so that the central axes of the lamp holders are vertical. Furthermore, a second upper lamp holder 21A is screwed into the upper end of the first upper lamp holder 20A, and a second lower lamp holder 21B is screwed into the upper end of the first lower lamp holder 20B. In addition, an upper lamp 22A is attached to the upper end of the second upper lamp holder 21A, and a lower lamp 22B is attached to the upper end of the second lower lamp holder 21B.

A focusing lenses 23A and 24A which convert the light 70A emitted by the upper lamp 22A into parallel projected light 71A are provided at the lower end of the first upper lamp holder 20A and the lower end of the second upper lamp holder 21A, respectively. Furthermore, a prism 25A with a 90-degree angle of reflection which converts the vertically oriented projected light 70A into projected light 72A is installed beneath the focusing lens 23A.

Similarly, focusing lenses 23B and 24B which convert the light 70B emitted by the lower lamp 22B into parallel projected light 71B are provided at the lower end of the first lower lamp holder 20B and the lower end of the second lower lamp holder 21B, respectively. In addition, a prism 25B with a 90-degree angle of reflection which converts the vertically oriented projected light 71B into projected light 72B which is oriented in the same direction as the projected light 72A is installed beneath the focusing lens 23B.

The prisms 25A and 25B are installed inside the case 15 with the prism 25B being positionally lower than prism 25A.

Inside the case 15, an upper objective lens 30A and a prism 31A with a 90-degree angle of reflection which converts the light 73A projected from the upper objective lens 30A into light 74A that is projected vertically upward are installed in the light path of the projected light 72A, a prism 31B with a 90-degree angle of reflection which converts the projected light 72B into light 73B that is projected vertically downward is installed in the light path of the projected light 72B, and a lower objective lens 30B which converts the projected light 73B into projected light 74B is installed in the light path of projected light 73B. The prisms 31A and 31B and the lower objective lens 30B are installed on the same vertical axis. In other words, the beam axes of the projected light 74A and a projected light 74B coincide. The prisms 31A and 31B are mounted to respective lens holders 33A and 33B. The lens holder 33A is fastened to the prism holder 32, and the lens holder 33B is fastened to the bottom lid 15b.

Accordingly, the projected light 74A strikes the chip 2, and thus becomes reflected light 80A (see FIG. 3). This reflected light 80A passes through the prism 31A and upper objective lens 30A, thus becoming reflected light 81A. Similarly, the projected light 74B strikes the circuit board 1, and thus becomes reflected light 80B. This reflected light 80B passes through the lower objective lens 30B and prism 31B, thus becoming reflected light 81B.

A half-mirror 40A which transmits the projected light 72A and reflects the reflected light 81A 90 degrees in a horizontal direction to turn it into a reflected light 82A is installed between the prism 25A and upper objective lens 30A. Similarly, a half-mirror 40B which transmits the projected light 72B and reflects the reflected light 81B 90 degrees to turn it into a reflected light 82B in the same direction as the reflected light 82A is installed between the prism 25B and prism 31B.

Figure 5:
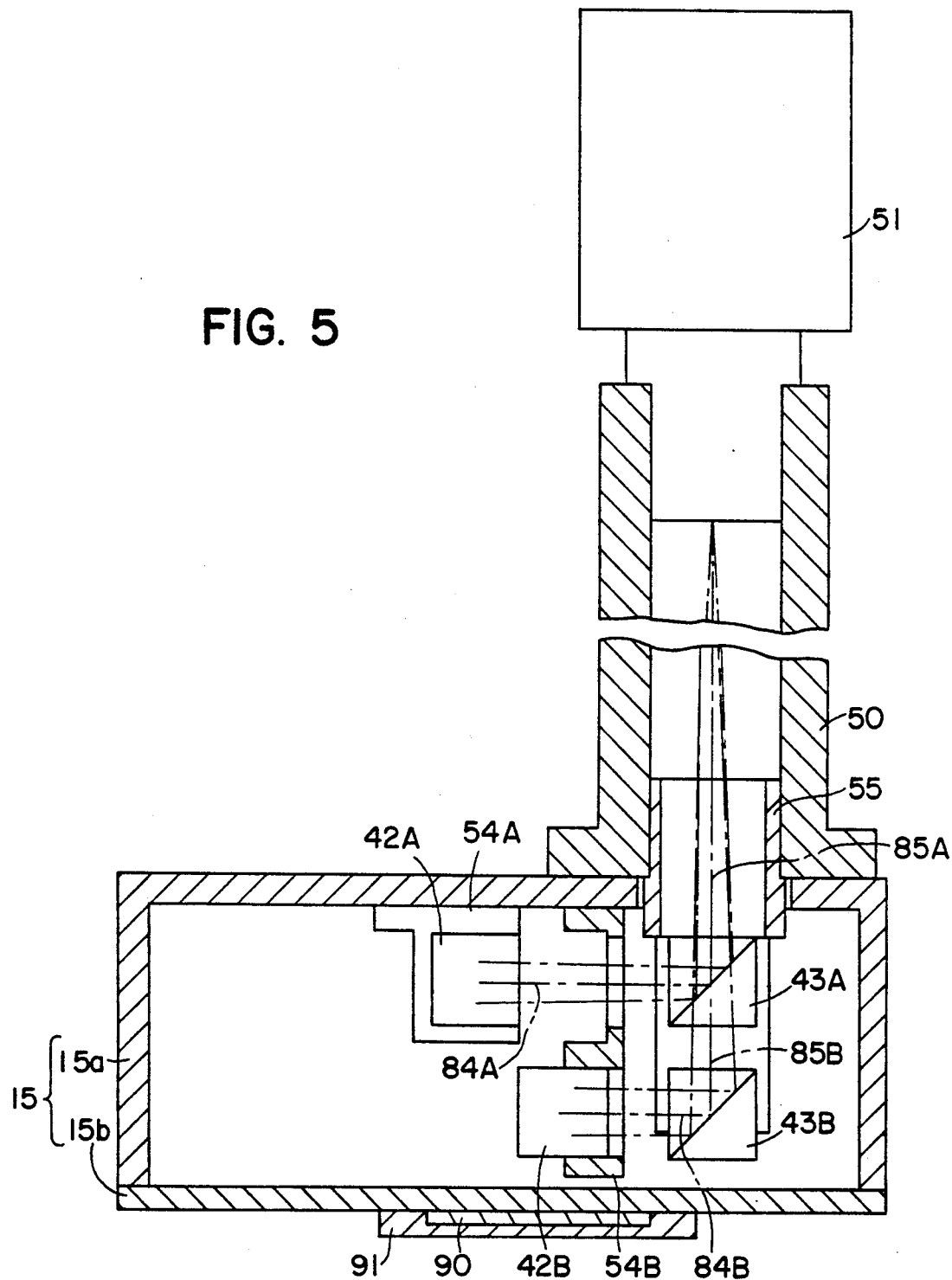
FIG. 5 is an enlarged cross section taken along line 5—5 in FIG. 1.
Figure 6:
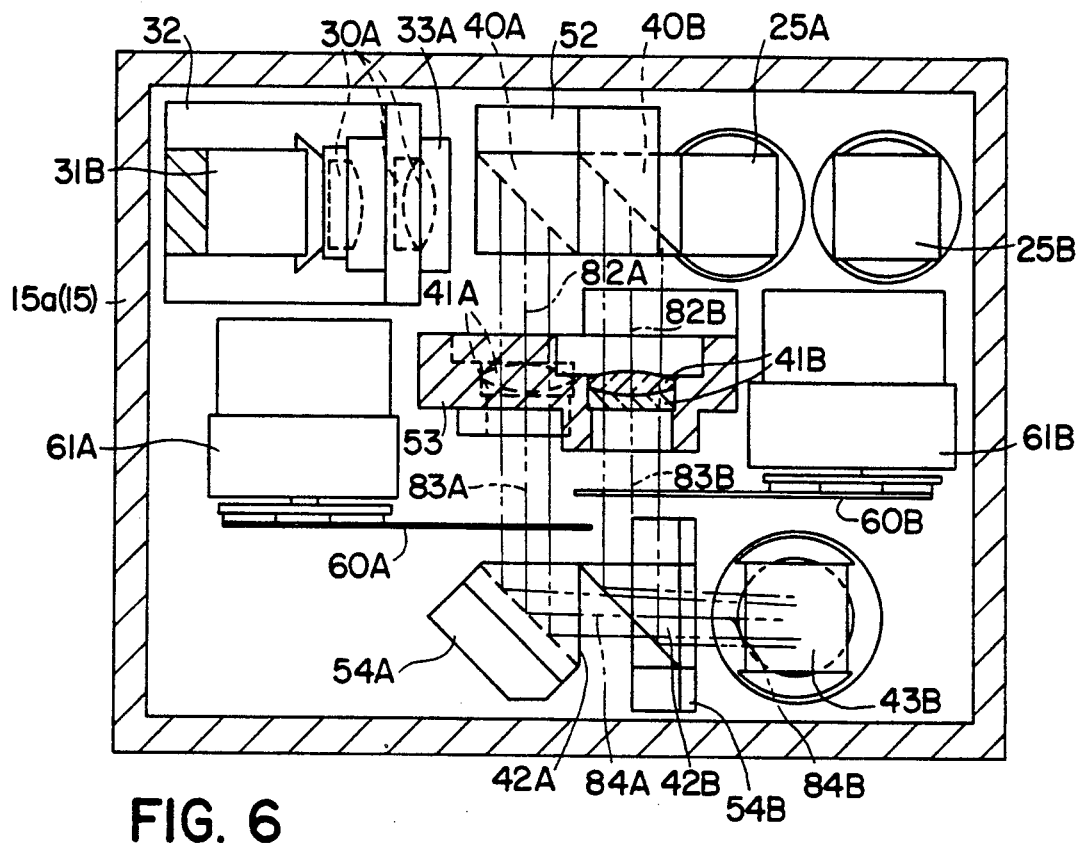
FIG. 6 is a cross section taken along line 6—6 in FIG. 4.

As shown in FIGS. 3, 5 and 6, an upper objective lens 41A and a prism 42A which reflects the reflected light 83A passing through the upper objective lens 41A 90 degrees to turn it into a reflected light 84A in a horizontal direction, which is opposite to the direction of the projected light 72A, are installed in the light path of the reflected light 82A. Similarly, a lower objective lens 41B and a prism 42B which reflects the reflected light 83B passing through the lower objective lens 41B 90 degrees to turn it to a reflected light 84B in the same direction as the reflected light 82A and in the same vertical plane as the reflected light 84A are installed in the light path of the reflected light 82B.

Furthermore, a prism 43A which reflects the reflected light 84A 90 degrees (vertically upward) to turn it into a reflected light 85A is installed in the light path of the reflected light 84A, and a prism 43B which reflects the reflected light 84B 90 degrees as reflected light 85B in the same direction as the reflected light 85A is installed directly beneath the prism 43A.

As seen in FIG. 5, a camera holder 50 is fastened to the upper surface of the case proper 15a above the prism 43a and a camera 51 is mounted to the upper end of this camera holder 50. Furthermore, the half-mirrors 40A and 40B are fastened to a mirror holder 52 (see FIGS. 4 and 6), the upper objective lens 41A and lower objective lens 41B are fastened to a lens holder 53, and the prisms 42A and 42B are fastened to respective prism holders 54A and 54B. The mirror holder 52, lens holder 53 and prism holders 54A and 54B are mounted to the case proper 15a. In addition, the prisms 43A and 43B are fastened to a prism holder 55 (see FIG. 5), the prism holder 55 being provided inside the camera holder 50.

As shown in FIG. 6, a shutter 60A is installed between the upper objective lens 41A and the prism 42A. This shutter 60A is rotated by a solenoid 61A which is fastened to the case proper 15a. Similarly, a shutter 60B is also installed between the lower objective lens 41B and the prism 42B. The shutter 60B is rotated by a solenoid 61B which is fastened to the case proper 15a.

As seen in FIG. 4, the focusing lenses 23A, 24A and 23B, 24B are arranged so that the light 70A emitted by the upper lamp 22A and the light 70B emitted by the lower lamp 22B are converted into parallel projected light 71A and parallel projected light 71B, respectively. The upper objective lens 30A and lower objective lens 30B are arranged so that the parallel projected light 72A and the parallel projected light 72B are respectively converted into projected light 74A and projected light 73B which are focused on the chip 2 and circuit board 1, respectively. Moreover, as shown in FIGS. 5 and 6, the upper objective lens 41A and lower objective lens 41B are arranged so that the parallel reflected light 82A and parallel reflected light 82B are respectively converted into reflected light 85A and reflected light 85B, which are focused on the camera 51.

Next, the operation of the above-described embodiment will be described:

First, prior to the bonding operation, the focal points of the optical system of the detecting device 10 are adjusted. This adjustment is accomplished in the following manner: i.e., first, with the circuit board 1 positioned on the hot plate 3 and the bonding tool 6, that holds the chip 2 by vacuum suction adhesion, positioned above the circuit board 1, the XY stage 13 is driven so that the upper detection port 16A and lower detection port 16B of the detecting device 10 are positioned between the circuit board 1 and the chip 2.

In this state, the vertical slider 14 is moved upward or downward, thus causing the detecting device 10 to move up and down. This results in that the light 74B projected by the lower objective lens 30B is focused on the circuit board 1. The vertical slider 14 is then fastened to the XY stage 13 in the position where this focus is achieved.

Next, a bonding tool vertical driving mechanism (not shown) which moves the bonding tool 6 up and down is driven so that the bonding tool is moved upward or downward, thus causing the light 74A projected by the upper objective lens 30A to be focused on the chip 2. The position of the bonding tool 6 (along the vertical axis) where this focus is achieved is stored as a detection position in a memory (not shown).

Afterward, when the bonding tool 6 conveys the chip 2 to a point above the circuit board 1, the bonding tool 6 is operated so that it is positioned in the detection position.

Once the focal-point adjustment of the optical system of the detecting device 10 has been completed as described above, an ordinary bonding operation is performed.

During this operation, the detecting device 10 is ordinarily positioned away from the area over the hot plate 3, and the shutters 60A and 60B are in a state which causes the reflected light 83A and reflected light 83B to be blocked.

Next, the bonding operation will be described:

The circuit board 1 is positioned on the hot plate 3 of the workpiece stand 5. Meanwhile, the bonding tool 6 picks up a chip 2 by vacuum suction adhesion from the chip pick-up position (not shown) and conveys the chip 2 so that it is positioned in the detection position above the circuit board 1. At this point, the XY stage is driven in the X and Y directions so that the upper detection port 16A and lower detection port 16B of the detecting device 10 are positioned between the circuit board 1 and chip 2. Next, the solenoid 61A is actuated so that the shutter 60A is rotated. As a result, the shutter 60A is positioned outside the light path of the reflected light 83A.

In this state, the light 70A emitted by the upper lamp 22A is directed onto the chip 2 after being turned into the projected light 71A, 72A, 73A and 74A. The projected light 74A is then directed into the camera 51 after being turned into the reflected light 80A, 81A, 82A, 83A, 84A and 85A. As a result, the position of the chip 2 is detected by the camera 51.

Next, the solenoid 61B is actuated, thus causing the shutter 60B to rotate so that the shutter 60B is positioned outside the light path of the reflected light 83B. The light 70B emitted by the lower lamp 22B is also directed onto the circuit board 1 after being converted into the projected light 73B, and the reflected light 80B resulting from the reflection of the projected light 74B by the circuit board 1 is directed into the camera (after being turned into the reflected light 85B) so that the position of the circuit board 1 is detected.

The images of the reflected light 85A and reflected light 85B detected by the camera 51 are inputted into an arithmetic unit (not shown). The positional discrepancy between the chip 2 and the circuit board 1 is calculated by the arithmetic unit. In accordance with the amount of this calculated positional discrepancy, the bonding tool 6 is driven in the X and Y directions by the driving means which drives the bonding tool 6 in the X and Y directions so that the position of the chip 2 is corrected.

Once the positional discrepancy of the chip 2 relative to the circuit board 1 is corrected as described above, the XY stage 13 is driven so that the detecting device 10 is withdrawn from the space between the circuit board 1 and chip 2. Furthermore, the solenoids 61A and 61B are actuated so that the shutters 60A and 60B block the reflected light 83A and reflected light 83B. Then, the bonding tool 6 is lowered so that the chip 2 is bonded to the circuit 1.

As seen from the above, the positional discrepancy of the chip 2 relative to the circuit board 1 is detected and corrected at the actual bonding position where the chip 2 is positioned above the circuit board 1. Accordingly, the bonding tool 6 is not affected by any mechanical operation error which would arise when driving the bonding tool 6 in the X and Y directions. Accordingly, high-precision positional alignment is possible.

The above description is made for the case wherein the positional discrepancy of the chip relative to the circuit board 1 is detected, and the position of the chip 2 is corrected. However, in a bonding machine equipped with a workpiece stand driving means for driving the workpiece stand 5 in the X and Y directions, it would be possible to detect the positional discrepancy of the circuit board 1 relative to the chip 2 and to correct this positional discrepancy of the circuit board side.

Furthermore, in the embodiment described above, shutters 60A and 60B are switched over when detecting two patterns, i.e., the pattern of the chip 2 and the pattern of the circuit board 1, and then these detected patterns are inputted into a singe camera.

It is also possible to install separate cameras for the respective patterns, to synthesize the images that are detected by the respective cameras by means of a synthesizer, and to observe this synthesized image on a television monitor. However, when two camera images are electrically synthesized, a slight discrepancy in the synchronizing signal will result in the generation of image distortion and noise. In addition, the amplifications of the two cameras cannot be accurately matched. Accordingly, such an arrangement is not suitable for the positional alignment of fine patterns. In this regard, the precision of positional alignment is extremely high when two objects (i.e., the chip 2 and circuit board 1) are observed by a single camera as in the embodiment described above. Furthermore, electrical or signal displacement, that is seen in cases where separate object images are obtained or where two object images are obtained, would not occur in this case.

In the above-described embodiment, as shown in FIGS. 2, 4 and 5, a heating means 91 which has a heater 90 is employed. If the detecting device 10 is heated by the heating means 91 to a temperature that is close to the ambient temperature, the thermal displacement of the optical system will remain stable from the beginning of operation to the end of operation. Thus, high precision can be obtained.

Incidentally, it is difficult to obtain a complete agreement between the optical axes of the projected light 74A and projected light 74B. More specifically, a discrepancy between these optical axes would be created by installation error of the respective parts of the two optical systems and by differences in the ambient temperatures of the light paths of the two optical systems.

Figure 7:
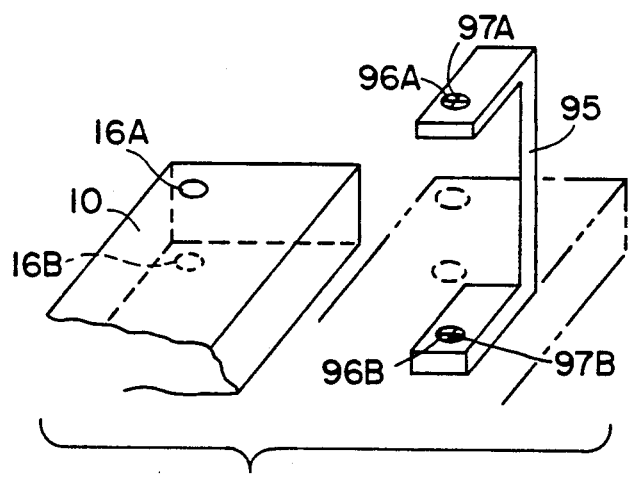
FIG. 7 is a perspective view of the primary standard.

In the present embodiment, as shown in FIGS. 1 and 7, a primary standard gage 95 is used which detects the optical axes of the projected lights 74A and 74B projected from the detection windows 16A and 16B of the detecting device 10. This primary standard gage 95 has a squared "C" shape and has glass plates 97A and 97B installed on the same axis above and below. Each plate is provided with cross mark 96A and 96B of a few microns wide.

Figure 8:
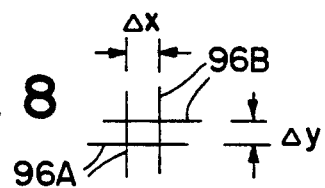
FIG. 8 is an explanatory diagram which illustrates discrepancy in optical axes.

Prior to the bonding operation, the XY stage 13 is driven so that the detection ports 16A and 16B of the detecting device 10 are positioned between the glass plates 97A and 97B of the primary standard gage 95. Then, the light 80A and 80B reflected by the cross marks 96A and 96B of the glass plates 97A and 97B from the light 74A and 74B projected by the lamp holders 20A and 20B is detected by the camera 51, and the amount of discrepancy between the optical axes of the projected light 74A and projected light 74B is detected. As seen in FIG. 8, this discrepancy is detected as respective discrepancies delta (Δ) x and delta (Δ) y between the upper cross marks 96A and lower cross marks 96B. The drift of the optical system is canceled by adding these discrepancies delta x and delta y to the bonding position data. Afterward, normal bonding is performed.

The discrepancies in the optical system of the detecting device 10 also can vary according to the ambient temperature. Accordingly, once bonding has been performed a specified number of times, the detecting device 10 is moved to the position of the primary standard gage 95 as described above. The discrepancy in the optical axes is detected there as described above, and the bonding position data is corrected. Then, beginning with the next bonding operation, bonding is performed according to this corrected data.

Figure 9:
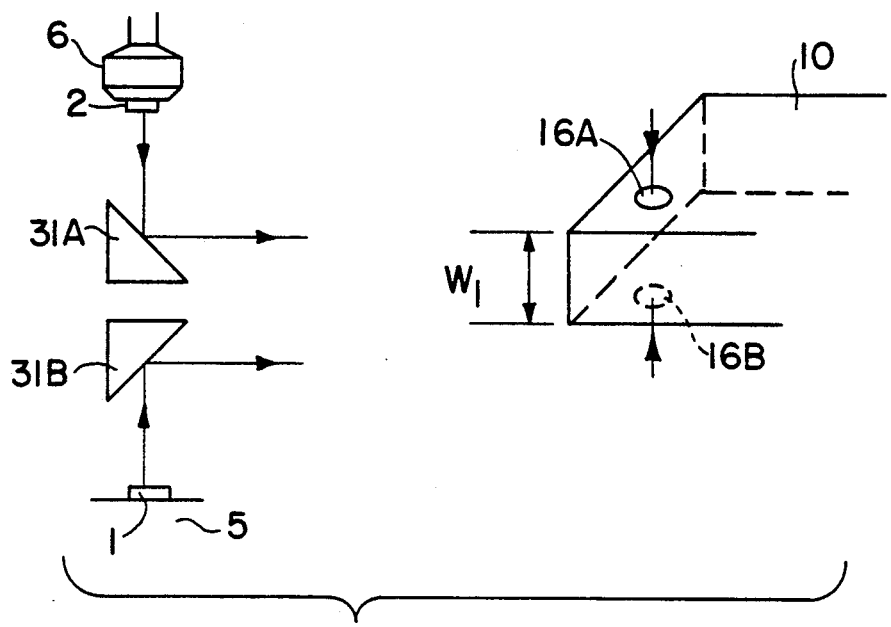
FIG. 9 is an explanatory diagram which illustrates detection ports.
Figure 10:
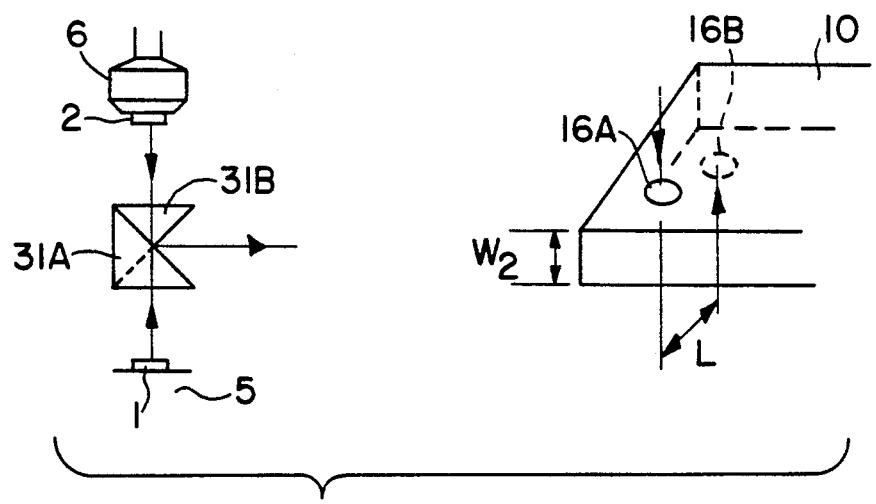
FIG. 10 is an explanatory diagram of the detection ports of another embodiment of the present invention.

FIG. 10 illustrates another embodiment of the present invention. In the previous embodiment, as shown in FIG. 9, the detection ports 16A and 16B are formed so that the projected light 74A and projected light 74B are coaxial. In this case, it was necessary to position the prisms 31A and 31B one above the other, so that the thickness of the detecting device 10 can be increased as indicated by W1 in FIG. 9. In the embodiment illustrated in FIG. 10, on the other hand, the detection ports 16A and 16B are formed so that they are offset by a distance L. As a result, the prisms 31A and 31B can be installed on the same horizontal plane, so that the thickness of the detecting device is reduced from the W1 to a smaller W2.

Accordingly, when detection is performed in this embodiment, it is necessary to position the detection port 16B above the circuit board 1 and to move the bonding tool 6 so that the chip 2 is conveyed to a point above the detection port 16A which is offset from the detection port 16B. Furthermore, after the positional discrepancy between the circuit board 1 and chip 2 has been detected, it is necessary to align the positions of the circuit board 1 and chip 2 by adding the offset distance L to the positional discrepancy before bonding is performed.

The above two embodiments are described relative to chip bonding. However, it goes without saying that the present invention is applicable to outer lead bonding, inner lead bonding, and the other bonding. In the case of inner lead bonding, the chips would be conveyed to a point beneath the tape carrier, and the positional discrepancy would be detected at this point. In other words, one part would be conveyed to a point beneath another part, and the positional discrepancy between the two parts would be detected.

As clear from the above description, in the present invention, a detecting device is positioned between two parts that are to be bonded with one of the parts positioned above the other, and a detection operation is performed using this apparatus. As a result, the two are not affected by any mechanical operating errors which would be caused by moving the parts in the X and Y directions after the detection. Accordingly, it is possible to make a high-precision positional alignment.

We claim:

1. A bonding apparatus wherein one part is held and conveyed to a point above or below another part so that said one part and said another part are positionally aligned and then bonded together, said bonding apparatus comprising a detecting device having upper and lower detection ports, a means for moving said detection device between said two parts with one of said parts positioned above or below the other part, and means for detecting respective patterns of said parts above and below by means of said upper and lower detection ports, and wherein said detecting device has a heating means which heats said detecting device to a temperature close to ambient temperature in order to compensate for thermal displacements of said detecting device.

2. A bonding apparatus wherein one part is held and conveyed to a point above or below another part so that said one part and said another part are positionally aligned and then bonded together, said bonding apparatus comprising a detecting device having upper and lower detection ports, a means for moving said detection device between said two parts with one of said parts positioned above or below the other part, and means for detecting respective patterns of said parts above and below by means of said upper and lower detection ports, and wherein said detecting device is mounted to an XY stage which can be moved in the XY directions and wherein said detecting device has a heating means which heats said detecting device to a temperature close to ambient temperature in order to compensate for thermal displacements of said detecting device.

3. A bonding apparatus wherein one part is held and conveyed to a point above or below another part so that said one part and said another part are positionally aligned and then bonded together, said bonding apparatus comprising a detecting device having upper and lower detection ports, a means for moving said detection device between said two parts with one of said parts positioned above or below the other part, and means for detecting respective patterns of said parts above and below by means of said upper and lower detection ports, and wherein said means for detecting comprises a camera and an optical system associated with said camera and said detecting device further comprises shutter means located at intermediate points in respective optical paths of said optical system through said upper and lower detection ports in order to switch between patterns of upper and lower parts supplying said patterns to said camera and wherein said detecting device has a heating means which heats said detecting device to a temperature close to ambient temperature in order to compensate for thermal displacements of said detecting device.

* * * * *